United States Patent [19]
Walls

[11] 3,936,343
[45] Feb. 3, 1976

[54] TAPE REMOVAL MACHINE

[75] Inventor: Robert R. Walls, Los Angeles County, Calif.

[73] Assignee: Western Magnum Corporation, Hermosa Beach, Calif.

[22] Filed: Apr. 8, 1974

[21] Appl. No.: 458,502

[52] U.S. Cl. .............. 156/368; 156/447; 156/450; 156/584; 242/72 R
[51] Int. Cl.² ................. B32B 31/16; B32B 35/00
[53] Field of Search .......... 156/584, 344, 446, 429, 156/457, 184, 189, 447, 448, 450, 469, 368; 242/117, 72, 74

[56] References Cited
UNITED STATES PATENTS

| 1,845,526 | 2/1932 | Spence, Jr. ........................... 242/72 |
| 2,130,727 | 9/1938 | Aument .............................. 156/184 |
| 2,721,042 | 10/1955 | Betz ..................................... 242/72 |
| 3,017,313 | 1/1962 | Lagasse et al. ..................... 156/446 |
| 3,617,424 | 11/1971 | Smith .............................. 156/584 X |

Primary Examiner—Douglas J. Drummond
Assistant Examiner—M. G. Wityshyn
Attorney, Agent, or Firm—Allen A. Dicke, Jr.

[57] ABSTRACT

Pressure-sensitive tape attached to and extending beyond the front edge of a stiff card is removed by grasping the extending end in jaws in a wind-up roller. Rotating the roller winds the tape thereon, facing outward. Upon completion of winding, the roller is stopped, the clamp jaws released, and the wrap of tape is thrust off the end of the cantilevered roller.

11 Claims, 7 Drawing Figures

TAPE REMOVAL MACHINE

BACKGROUND

This invention is directed to a tape removal machine, and particularly a tape removal machine where pressure-sensitive adhesive tape is removed from the surface of a stiff card.

In one particularly important utility, tape is applied to printed circuit boards. Printed circuit boards are insulated substrates, often of epoxy filled fiberglass, with conductor paths on the surface. These conductor paths are formed in a laminated metallic layer by optical-chemical methods, by deposition or etching away. In the continued treatment of such printed circuit boards, it is often desirable to chemically treat an area thereof which is delineated by a straight line.

In modern practice this straight line is created by the application of pressure-sensitive tape to the board. In order to protect both sides of the board, pressure-sensitive tape is usually applied to both sides of the board, in exact alignment across the board. Now, this tape permits the partial immersion of the board for chemical purposes to treat the board for circuit purposes, and a line of demarcation beyond which the chemical is stopped is readily established.

The board thus having pressure-sensitive tape applied thereto, after the chemical treatment it is desirable and usually necessary to remove the tape. Prior methods of tape removal have been slow and have required a considerable amount of manpower.

SUMMARY

In order to aid in the understanding of this invention it can be stated in essentially summary form that it is directed to a tape removal machine. The tape removal machine includes clamp jaws in a tape winding roller. The machine is arranged so that the tape end extending beyond the edge of the stiff card can be inserted into the clamp jaws, and after clamping the jaws, rotation of the roller causes unwinding of the tape from the card.

It is thus an object of this invention to provide a tape removal machine which quickly, economically, accurately, and easily removes tape from a stiff card.

It is a further object of this invention to provide a tape removal machine which has a roller, with clamp jaws associated with the roller so that an extending tape end can be clamped in the jaws and with roller rotation the tape is wound off of the stiff card and on to the roller, thus to remove tape from the card. It is a further object to provide a tape removal machine which has the necessary controls and interlocks so that it quickly and reliably operates.

Other objects and advantages of this invention will become apparent upon the study of the following portion of the specification, the claims, and the attached drawings.

DESCRIPTION

Figure 1:
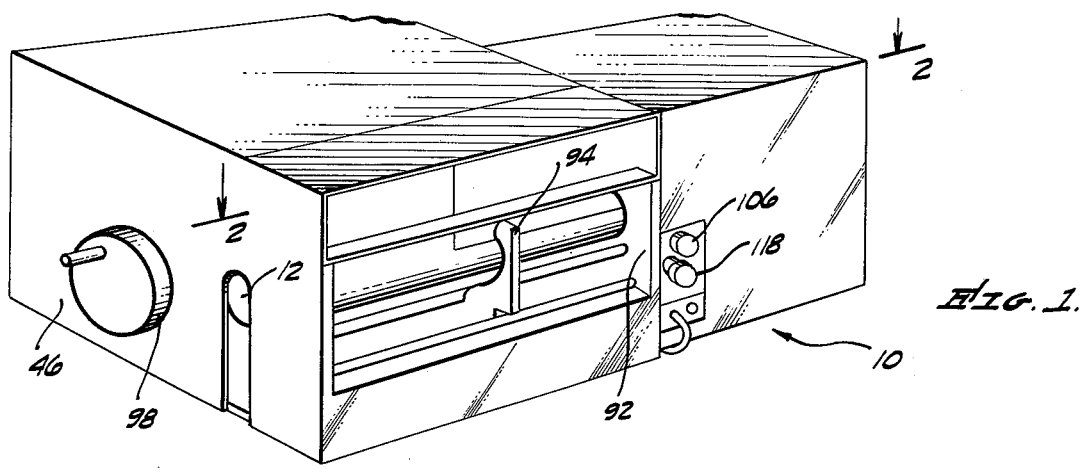
FIG. 1 is an isometric view of the tape removal machine of this invention.
Figure 2:
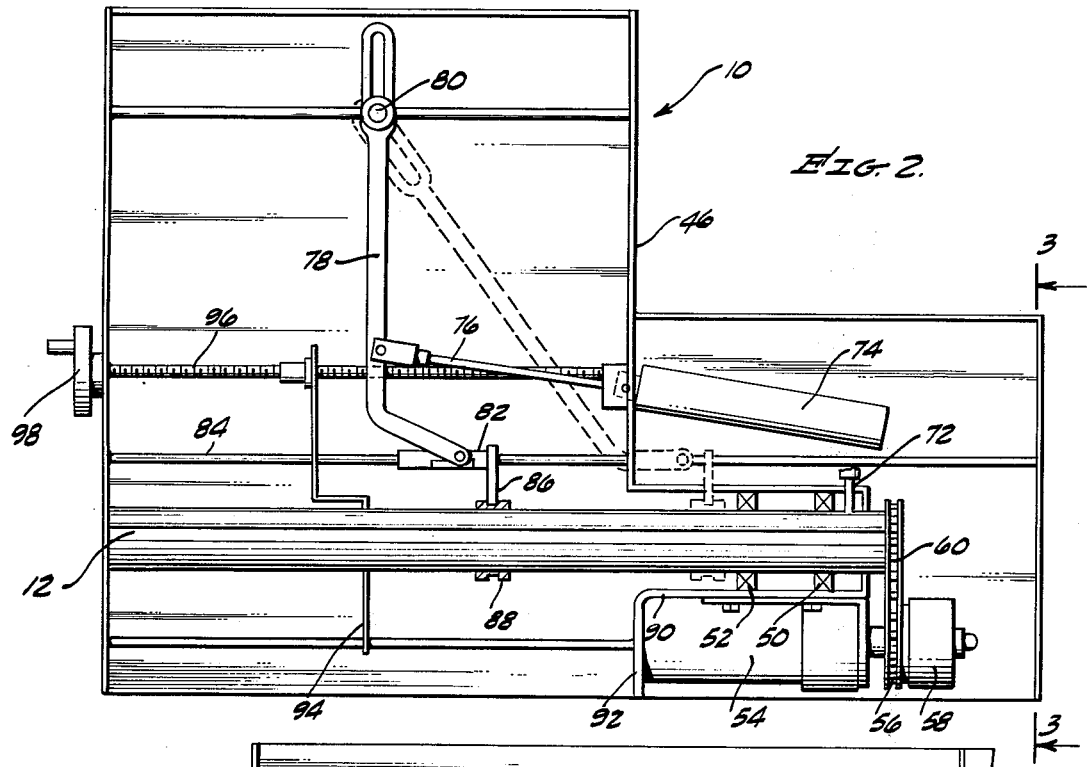
FIG. 2 is a plan view thereof, with the top cover removed, as seen along the line 2—2 of FIG. 1.
Figure 4A:
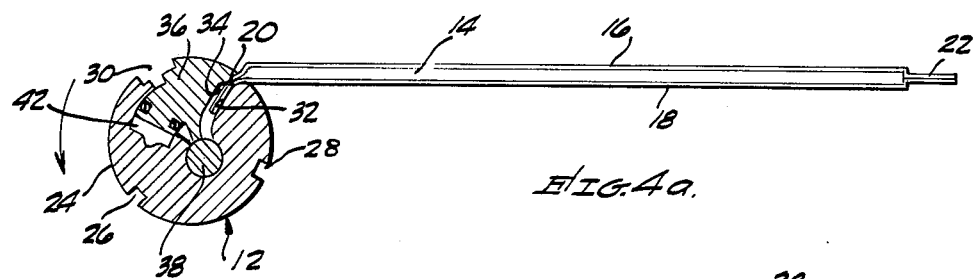
FIGS. 4a, 4b, and 4c are sections taken through the tape removal roller showing the roller in three different winding conditions.
Figure 4B:
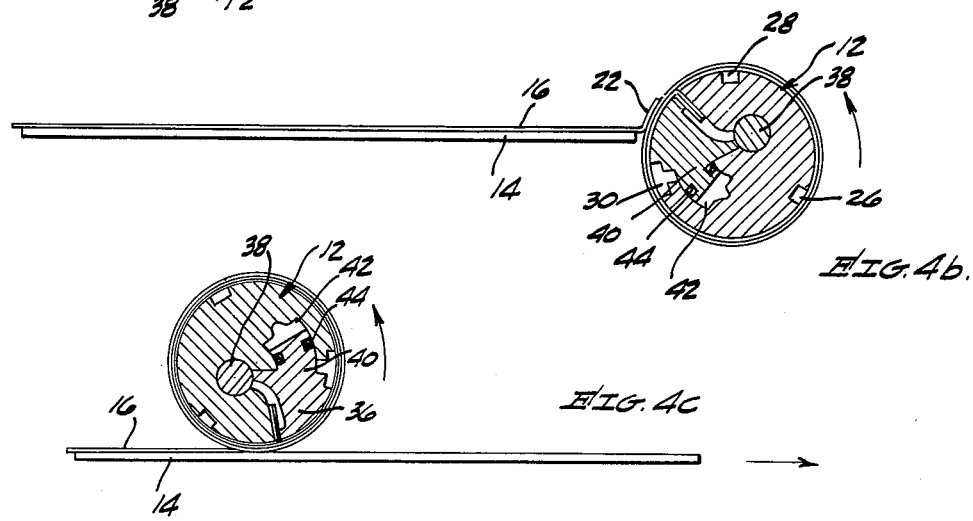
Figure 4C:
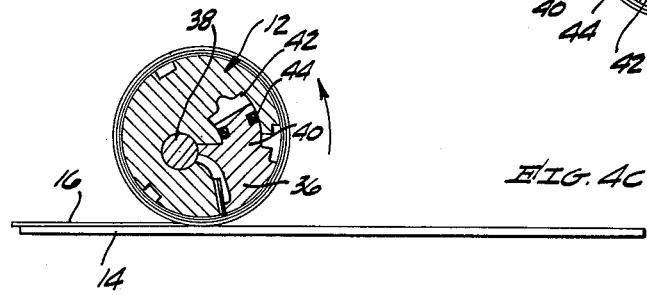

The tape removal machine is generally indicated at 10 in FIGS. 1 and 2. FIGS. 4a, 4b, and 4c show the roller 12 which actually engages the tape and removes it. FIG. 4a illustrates board 14 which has tape lengths 16 and 18 attached to opposite sides of it. As described above, tape is applied to printed circuit boards to physically mask off a certain area and expose one board edge so that board edge may be chemically treated. The tapes are applied in any convenient way and are required to be as accurately located as is required by the board design. Pressure-sensitive tape is employed for this purpose. In the application of the pressure-sensitive tape, the tape ends 20 and 22 extend beyond the end of the board. These tape ends are adhesively secured together by the same pressure-sensitive adhesive that holds the main part of the tape lengths against the board.

Roller 12 is a substantially cylindrical roller having an outer surface 24. The roller is preferably of uniform cross-section, and is preferably made by extrusion. Externally, roller 12 has three grooves 26, 28, and 30 extending the length thereof. These grooves are axial. An important structure of the roller is the clamp formed therein. Fixed clamp jaw 32 is formed as part of the main part of the roller. Movable jaw 34 is formed on pivoted jaw carrier 36. Jaw carrier 36 pivots on integrally formed pivot pin 38. Piston 40 is formed on the rear of the jaw carrier away from movable jaw 34. Rectangular cylinder 42 is formed in the body of roller 12. Sealing is accomplished by means of O ring 44 placed in the rectangular O ring groove formed around the exterior rectangular piston 40. The arcuate shape of the piston and its cylinder corresponds to the location of the pivot point 38. It is seen that introduction of pressure fluid into cylinder 42 causes clamping of the movable jaw onto the fixed jaw.

FIGS. 4a, 4b, and 4c illustrate the tape removal process. Just prior to the condition of FIG. 4a, cylinder 42 is not pressurized and the jaws are open. The roller is in a predetermined position, and the board 14 is inserted through guides so that tape end 20 enters between the open jaws. Upon operation of the start signal, the jaws are closed to clamp tape end 20, and roller 12 is rotated in the direction of the arrow in FIGS. 4a, 4b, and 4c. Tape 16 is tensioned where it crosses the forward upper edge of board 14 and becomes tape end 20, as the roller starts rotating. The tape tears at that location. If necessary, the tape can be weakened or cut at that point to aid in this separation. Now, while both layers of tape end 20 are clamped, only tape length 18 is attached. As the roller 12 rotates in a counter-clockwise direction of FIG. 4, board 14 is propelled to the left and tape 18 is unwound on the outer surface 24 of the roller. Board 14 is propelled to the left over the top of the roller and is appropriately guided. The pressure sensitive portion of the tape is directed outward as tape length 18 is unwound off the bottom of the board. As this unwinding proceeds, the board moves to the left under the guidance of the necessary guides within the housing of the machine. When unwinding proceeds to the point that tape end 22 is reached by roller 12, there is sufficient adhesion at tape end 22 so that the two tapes are held together. FIG. 4b illustrates the position of the board and the tape when the tape length 18 is completely unwound, and the right end of board 14 is passing around the left end of the roller. The right end of the board follows the roller around, with tape end 22 on the roller, and tape removal proceeds with removal of tape length 16. FIG. 4c illustrates the condition of unwinding with board 14 now below roller 12, and with tape length 16 being removed from the upper surface of the board and wound onto the roller. Board 14 is moving to the right and is finally ejected. Following ejection, the roller 12 is stopped and the tape removed in the manner described below.

Support and rotary management of roller 12 is accomplished by the structure within housing 46 of the machine. Roller 12 is mounted on bearings 50 and 52. The bearings are fixed within the housing and provide the necessary cantilever support for roller 12.

Motor 54 is mounted on the housing and drives sprocket 56 through clutch assembly 58. Clutch assembly 58 is of such structure that when the clutch is appropriately energized, sprocket 56 is driven, and when the brake is appropriately energized, sprocket 56 is locked. Chain 60 interconnects sprocket 56 with sprocket 62. Sprocket 62 is mounted directly on the end of roller 12 so that they are rotated when the clutch is engaged.

Figure 3:
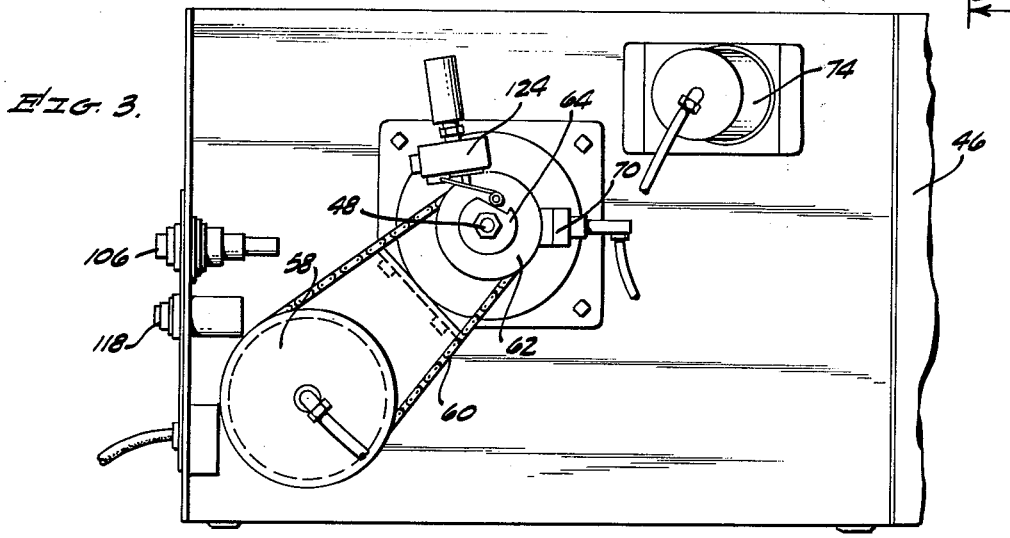
FIG. 3 is an end view of the machine, with the cover removed, as seen from along the line 3—3 of FIG. 2.

In order that the roller 12 be properly positioned at the beginning of the cycle for insertion of the tape end, and for purposes of cleaning the roller, described below, it is necessary that the roller stop in a predetermined position. Cam 64 is fixed on sprocket 62. Cam 64 has a sharp drop-off, as is seen in FIG. 3. Valve 124 is operated by the cam to signal when the shaft is in the desired "home" position. Additionally, roller 12 has a tapered lock hole therein. For adjustment, this lock hole can be in a disc under sprocket 62. Cylinder 70 has a lock plunger 72 which can engage in the lock hole for locking roller 12 in its home position. The operation of these controls is described below with respect to the control circuit.

Cleaning cylinder 74 is pivotally mounted on housing 46. Its piston rod 76 is pivotally connected to cleaning lever 78. The rear end of cleaning lever 78 is slidably and pivotally connected at pivot pin 80, which is secured to housing 46. The inner end is pivoted to guide collar 82 which slides on guide rod 84. Fork 86 is mounted on guide collar 82 and engages around cleaning collar 88. Fork 86 is conveniently fixed to cleaning collar 88 because the cleaning collar rotates with roller 12. By operation of cleaning cylinder 74, cleaning collar can be removed from the parking position where it is retracted within bearing housing tube 90, out along the length of roller 12 all the way to the end. Cleaning collar 88 has fingers which extend into the grooves 26, 28, and 30 so that it properly engages under any tape wound on the roller. It should be noted that, due to the position of pivot pin 38 with respect to the center axis of surface 24, when the clamp is disengaged, the surface at jaw carrier 36 is retracted below the circumferential line of outer surface 24 to release the tension on the tape. Thus, with engagement of the fingers in the grooves, the tape can be slid along the length of the roller and off its free end.

Guides are provided for the printed circuit board as it passes through the machine. The right side of the board is guided on wall 92, and the left side on adjustable side guide 94. Side guide 94 is adjustable in position by means of screw 96, controlled by crank in accordance for adjustment inaccordance with the width of a printed circuit board to be stripped of its tape. In addition, the several bars visible in FIG. 1 control the board as it moves through the removal cycle illustrated in FIGS. 4a, 4b, and 4c, to prevent the board from rotating in accordance with the torque imparted onto it by the rotation of the stripping roller. Furthermore, a sensor detects the presence of a board in the machine. The sensor can work directly from board pressure or it can be proximity sensing, or it can be operated by contact with the board guide rods. In any event, the machine 10 knows when the board 14 is being ejected after having its tape removed.

The electrical system of machine 10 is fairly elementary. Electric motor 54 is supplied with electricity through an air-operated on-off control switch. The pneumatic system thus controls the turning on and off of motor 54.

Figure 5:
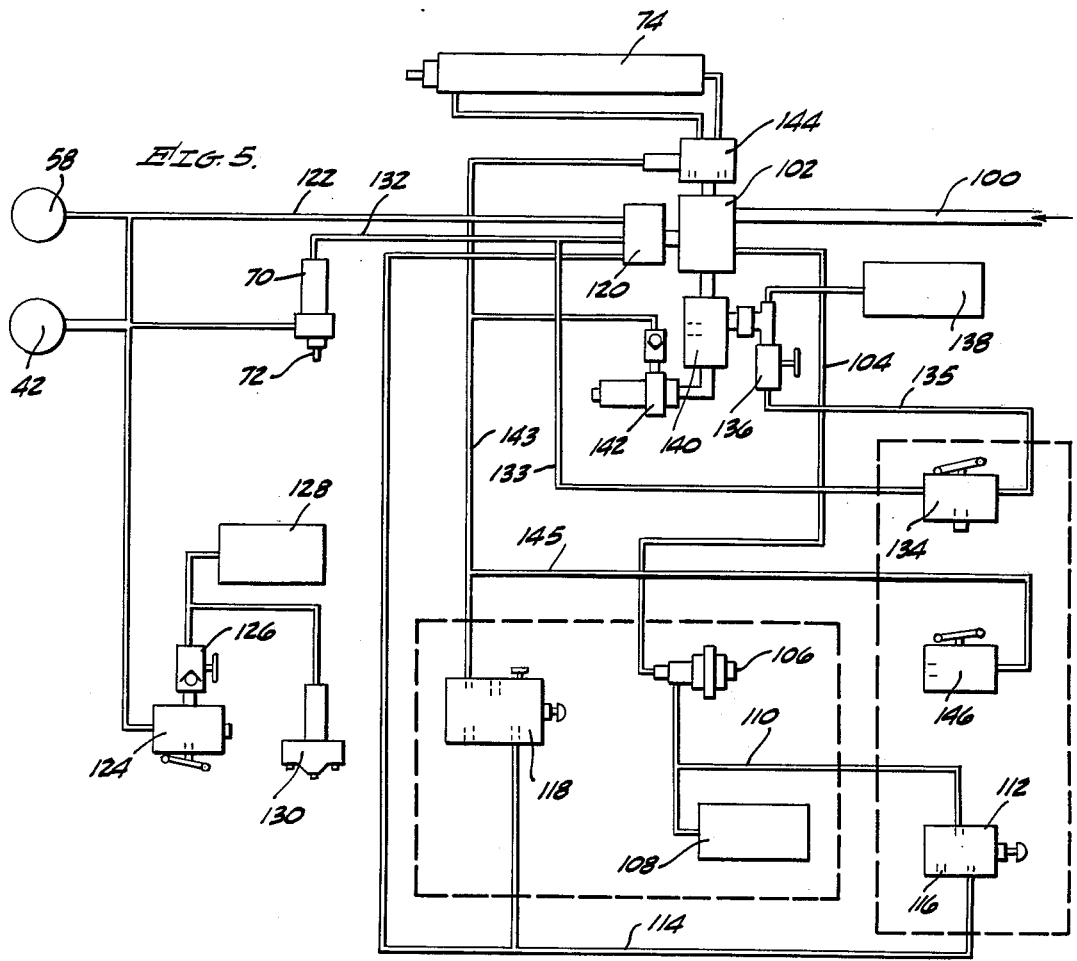
FIG. 5 is a substantially schematic diagram of the pneumatic system of signalling devices and actuators which control the tape removal machine.

FIG. 5 schematically illustrates the pneumatic control circuit. Air inlet 100 supplies air to distributor 102 which has four air outlets. Line 104 supplies air under pressure to start valve 106 which is available to the operator by which he starts the cycle. The operator places the board into the board guide slot so that its forward tape end 20 goes into the slot between the open jaws of mandrel 12. Thereupon he presses start valve 106. Pressing of the valve supplies air to volume chamber 108 so that line 110 normally remains presurized even after start valve 106 is manually released. Valve 112 is arranged so that it operates when the board is ejected. With the board in the inlet position at the beginning of the cycle, line 110 is opened through valve 112 to line 114. Upon arrival of the front edge of the board, valve 112 vents line 110 and volume chamber 108 to atmosphere through exhaust 116. Upon arrival of the rear edge of the board, valve 112 vents line 114 to volume 108 to reduce its pressure below critical to drop valve 120. Reset valve 118 is normally closed and does not normally enter into the normal operation sequence. It is employed in the event of a machine malfunction. Reset valve 118 is normally closed and does not normally vent line 114. Line 114 goes to the bottom of sequence valve 120. Sequence valve 120 is also supplied by air under pressure and has an internal spool which is lifted by pressure in line 114. When lifted, air from the supply is passed through from manifold 102 to line 122. When line 122 is pressurized clutch 58 is actuated, clamp jaw 36 is operated by pressurizing of clamp cylinder 42, and air goes to the bottom of cylinder 70 to lift lock plunger 72, and air goes to motor sequence valve 124. Out of the motor sequence valve 124 the air goes through an adjustable needle valve 126 which controls flow to control delay. Flow out of the needle valve supplies air volume chamber 128. When the chamber pressure rises to a sufficient level, air-operated switch 130 starts the motor. With the time delay provided by needle valve 126 and chamber 128, the necessary preliminary steps are made before the motor starts. With motor start, winding occurs, so that the tape is wound off the board and the board is ejected.

Upon ejectment of the board, valve 112 vents, causing dropping of the sequence valve 120. This action releases clutch 58, depressurizes cylinder 42, causes lock direction urging of the lock plunger 72. The windup mandrel 12 continues rotation through inertia and internal clutch drag until it reaches its stop point. Then the lock plunger 72 is inserted. Now, the machine is ready for the mandrel cleaning part of the cycle. With the jaw carrier 36 retracted, the circumference of the mandrel is reduced so that tape wound on the mandrel is sufficiently loose to be thrust off the end. Springs urge the piston 40 into the cylinder 42 so that the jaw carrier 36 goes to the open position as soon as air is released from cylinder 42. Motor sequence valve 124 has an internal valve, which permits outflow of air from chamber 128 out line 122. When the follower on motor sequence valve 124 reaches the low point in cam 64, motor sequence valve 124 is thus actuated to vent chamber 128 to line 122, thus turning off switch 130 to turn off the motor. With sequence valve 120 in the position where line 122 is de-pressurized, line 132 is pressurized to thrust pin 72 into its shaft locking position.

With line 132 pressurized, line 133 is pressurized to supply air under pressure to valve 134. When the lid is closed, valve 134 is open to permit continued cycling. Valve 134 is a lid-closed interlock for safety purposes. With the lid closed, line 135 is then pressurized and supplies air to cleaning ring delay needle valve 136. The needle valve 136 has controlled flow in the upward direction as seen in the drawing, as an adjustable needle valve, but has a bypass check valve in the down direction to permit free flow. Flow upward through needle valve 136 supplies air to cleaning ring time delay volume chamber 138, so that the pre-determined dealy is achieved depending upon the air flow through needle valve 136, the volume of chamber 138 and the pressure at which the downstream device operates. The downstream device is pilot actuated three-way valve 140 which actuates at a pre-determined pressure and connects air under pressure when so actuated to the input of one shot valve 142. One shot valve 142, when actuated, builds pressure in line 143 and then shuts off. Line 143 is connected to four-way pilot operated valve 144 which is connected between pressure distributor 102 and cleaning ring actuating cylinder 74. When the pilot is pressurized on valve 144, the cleaning ring is driven in the cleaning direction toward the cantilever outer end of roller 12. Thus, the cleaning ring is moved toward the outer end of its stroke. When it reaches the outer end of its stroke, cleaning ring return valve 146 is actuated to dump the air from lines 143 and 145 to atmosphere. No more air is supplied to this line during this cycle because valve 142 is a one shot valve. Thus, pilot operated cleaning ring valve 144 is returned to a position where the pressure on cylinder 74 is reversed and the cylinder is retracted to retract the cleaning ring. Valve 120 is still down and line 132 is still pressurized, and the circuit is thus ready for the next cycle. As previously described, the next cycle is initiated by pressing the start valve 106.

Reset valve 118 is in effect a double two-way valve. In its normal condition, lines 114 and 143, connected to reset valve 118, are both shut off, that is, not vented or not connected to anything at the valve. However, by actuation of reset valve 118, both lines 114 and 143 are separately vented to atmosphere. This shuts off the entire pneumatic circuit so that there is no danger to the operator that parts will be moved under power. Thus, the operator is safe from harm while making adjustments or the like. If it were not for such a valve, the operator might work in the machine to remove a jam or the like, and inadvertently operate a valve which would start operation to result in harm to the operator. Thus, reset valve 118 is a safety valve.

The pneumatic logic circuit of FIG. 5 thus provides a structure which automatically cycles the machine and provides safety to the operator, so that the machine is automatic in operation. The components in connection with the pneumatic logic circuit are shown in physical position in the other figures of the drawings.

This invention having been described in its preferred embodiment, it is clear that it is susceptible to numerous modifications and embodiments within the ability of those skilled in the art and without the exercise of the inventive faculty. Accordingly, the scope of this invention is defined by the scope of the following claims.

I claim:

1. A tape removing machine for removing tape which is adhesively secured to one side of a board so that it extends beyond one edge of the board comprising:
   a roller, said roller comprising a mandrel and a jaw carrier, said mandrel having a substantially cylindrical exterior surface, said mandrel having an axis substantially central of said cylindrical surface and said mandrel having a jaw thereon, said jaw carrier being pivoted on said mandrel and having another jaw thereon, said jaw carrier being pivoted on said mandrel on the side of said mandrel axis away from said jaw carrier surface, a cylinder and piston respectively formed in said mandrel and on said jaw carrier so that fluid under pressure in said cylinder causes clamping of said jaws to clamp tape between said jaws and upon release of fluid pressure to release clamped tape and release circumferential tension;
   means for rotating said roller so that as said roller is rotated when the tape is grasped in said jaws the tape is wound around said roller; and
   means for removing tape wrapped around said roller.

2. The machine of claim 1 wherein said rotating means comprises a motor, said motor being connectible to rotate said roller, said rotating means including stop means for stopping said roller at the predetermined angular position at which the jaws are positioned for entry of the tape end.

3. The machine of claim 2 wherein said stop means comprises the stop pin engageable in a stop hole for locking said roller in a particular angular position and angular position detecting means for controlling entry of said pin into said stop hole.

4. The machine of claim 3 wherein said rotating means includes an electric motor for driving said roller and a clutch interposed between said motor and said roller, said clutch being engagable to rotate said roller.

5. A tape removing machine for removing tape which is adhesively secured to one side of a board so that it extends beyond one edge of the board comprising:
   a roller, said roller comprising a mandrel having a substantially cylindrical exterior surface, said mandrel having an axis substantially central of said circumferential surface, a jaw on said mandrel, a jaw carrier pivoted on said mandrel, another jaw on said jaw carrier, said jaw carrier being pivoted on said mandrel on the side of said mandrel axis away from said jaw carrier surface, a cylinder and a piston respectively formed in said mandrel and on said jaw carrier so that fluid under pressure in said cylinder causes clamping of said jaws to clamp tape therebetween;
   means for rotating said roller so that, as said roller is rotated when the tape is grasped in said jaws, the tape is wound around said roller, said rotating means comprising a motor, said motor being connectible to rotate said roller, said rotating means including stop means for stopping said roller at the predetermined angular position at which the jaws are positioned for entry of the tape end, said stop means comprising a stop pin engageable in a stop hole for locking said roller in the particular angular position, and angular position-detecting means for controlling entry of said pin into said hole; and means for removing tape wrapped around said roller.

6. The machine of claim 5 wherein said tape removing means comprises a cleaning ring embracing said roller and motive means for moving said cleaning ring along the length of said roller to remove tape from said roller.

7. A tape removing machine for removing tape which is adhesively secured to one side of a board so that it extends beyond one edge of the board comprising:
   a roller;
   jaws on said roller for clamping on the end of the tape extending beyond the board;
   means for rotating said roller so that as said roller is rotated when the tape is grasped in said jaws, the tape is wound around said roller;
   means for removing tape wrapped around said roller, said means for removing tape comprising a cleaning ring embracing said roller and motive means for moving said cleaning ring along the length of said roller, axial grooves along the exterior length of said roller, said cleaning ring having lugs which extend into said axial grooves so that said lugs extend below the circumferential surface of said roller to urge tape along the length of said roller to remove tape from said roller as said cleaning ring is urged along said roller.

8. The machine of claim 7 wherein said means to urge said cleaning ring is a fluid cylinder.

9. A tape removing machine for removing tape which is adhesively secured to one side of a board so that it extends beyond one edge of the board comprising:
   a roller, said roller comprising a mandrel having a substantially cylindrical exterior surface and having an axis substantially central of said circumferential surface, a jaw on said mandrel, a jaw carrier pivoted on said mandrel, another jaw on said jaw carrier, said jaw carrier being pivotable on its pivot axis so that its jaw goes into clamping relationship to said jaw on said mandrel, said jaw carrier having an exterior surface which is substantially in line with said cylindrical surface of said mandrel when in the clamped position and is retrated below the line of said circumferential surface when said jaw carrier is moved to the unclamped position to release tension on tape wrapped on said mandrel;
   a cylinder and a piston respectively formed in said mandrel and on said jaw carrier so that fluid under pressure in said cylinder causes clamping of said jaws;
   means for rotating said roller so that, as said roller is rotated when the tape is grasped in said jaws, the tape is wound around said roller, said means for rotating comprising a motor, said motor being connectible to rotate said roller, said rotating means including stop means for stopping said roller at the predetermined angular position at which the jaws are positioned for entry of the tape end, said stop means comprising a stop pin engageable in a stop hole for locking said roller in a particular angular position and angular position detecting means for controlling entry of said pin into said stop hole; and
   means for removing tape wrapped around said roller.

10. A tape removing machine for removing tape which is adhesively secured to one side of a board so that it extends beyond one edge of the board comprising:
    a roller, said roller being an extrusion of uniform cross-section throughout its length, said roller having a substantially cylindrical surface which is cylindrical substantially about the axis of roller rotation, a fixed jaw on said roller, a movable jaw carrier pivotable on said roller on a jaw carrier pivot axis, a jaw on said movable jaw carrier, means for moving said jaw carrier to move said movable jaw in a clamping direction towards said fixed jaw comprising a fluid cylinder formed in said roller, said fluid cylinder having a substantially rectangular cross-section in a plane which contains the axis of rotation of said roller and having side walls which are substantially cylindrical about the pivot axis of said jaw carrier so that, upon introduction of fluid under pressure into said cylinder, a tape can be clamped to retain said jaws, an exterior surface on said jaw carrier, said exterior surface lying in a plane with said cylindrical surface of said roller when said jaw carrier is in clamped position, said axis of rotation of said jaw carrier on said roller being positioned so that, when said jaw carrier is in the jaw unclamped position, said surface on said jaw carrier is retracted below the cylindrical surface of said roller to release tension on tape wound thereon;
    means for rotating said roller so that, as said roller is rotated when the tape is grasped in said jaws, the tape is wound around said roller; and
    means for removing tape wrapped around said roller.

11. The machine of claim 10 further including a pneumatic logic system for sequentially controlling the operations of said tape removing machine.

* * * * *